United States Patent
Chen et al.

(10) Patent No.: US 8,186,245 B2
(45) Date of Patent: May 29, 2012

(54) MECHANICAL DEVICE FOR TRANSMITTING TORQUE TO GENERATE MULTI-DEGREE-OF-FREEDOM ROTATION

(75) Inventors: Nien-Tsu Chen, Taichung (TW); Hung-Yu Peng, Jhudong Township, Hsinchu County (TW); Jyh-Shin Chen, Hsinchu (TW); Chi-Hung Huang, Hsinchu (TW)

(73) Assignee: National Applied Research Laboratories, Hsinchu (TW)

( * ) Notice: Subject to any disclaimer, the term of this patent is extended or adjusted under 35 U.S.C. 154(b) by 657 days.

(21) Appl. No.: 12/292,864

(22) Filed: Nov. 24, 2008

(65) Prior Publication Data

US 2010/0116203 A1    May 13, 2010

(30) Foreign Application Priority Data

Jun. 2, 2008  (TW) .............................. 97120526 A

(51) Int. Cl.
*B23B 29/24*  (2006.01)
*B23Q 16/00*  (2006.01)
*B23Q 16/02*  (2006.01)
*B23Q 17/00*  (2006.01)

(52) U.S. Cl. ........................................ 74/813 R; 74/825
(58) Field of Classification Search ............... 74/813 R, 74/822, 825, 826, 416; 269/55, 56, 57, 58, 269/61, 71
See application file for complete search history.

(56) References Cited

U.S. PATENT DOCUMENTS 3,861,353 A * 1/1975 Erhart et al. .................. 118/725

* cited by examiner

*Primary Examiner* — Justin Krause
(74) *Attorney, Agent, or Firm* — Haverstock & Owens LLP

(57) ABSTRACT

A mechanical device for transmitting a torque so as to generate a multi-degree-of-freedom rotation is provided. The mechanical device is used for clipping specimens during a vacuum sputtering process. The mechanical device includes an immovable frame, a first and a second shafts and a first and a second connecting elements. The immovable frame fastens the mechanical device, and includes a first hole and a first sleeve, which is disposed in the first hole and has a first transmission element. The first shaft is disposed inside the first hole and the first sleeve, and has a second hole. The second shaft is disposed in the second hole, and is perpendicular to the first shaft.

14 Claims, 4 Drawing Sheets

MECHANICAL DEVICE FOR TRANSMITTING TORQUE TO GENERATE MULTI-DEGREE-OF-FREEDOM ROTATION

FIELD OF THE INVENTION

The present invention relates to a transmission device, and more particularly to a device for transmitting a torque to generate a multi-degree-of-freedom rotation for a specimen clipped by the device.

BACKGROUND OF THE INVENTION

In the field of mechanical, electronic, and semiconductor industries, sputtering is one of the most popular methods for forming a paint film (thin film) on the surface of a material to add on a certain character to the material. Sputtering is a method of physical vapor deposition, which is broadly adopted by the industries for its wide applications as well as being unrestricted to the material, either metal or non-metal. The concept of sputtering is that atoms are ejected from the surface of a solid target material due to bombardment of the target by energetic ions in a vacuum environment and then adhered to a substrate (the material) to form a thin film.

The fundamental principle of sputtering is to bombard the surface of the solid target with accelerated ions and end up with sputtered atoms from the surface of the solid target after a momentum exchange between the ions and the atoms. Usually, the target is located at the cathode while the matter to be plated (say specimen substrates or disks) is located at the anode. To stimulate the plasma of a sputtering gas, a voltage of multi-million volts is applied to the cathode. The negative voltage applied to the cathode accelerates positive ions in the sputtering gas plasma toward the surface of the cathode. When the positive ions eventually collide with the surface of the target, atoms on the surface of the target are ejected out and move toward the substrate located at the anode. The atoms will then be plated on the surface of the substrate.

Based on the electrical power used during the process, the sputtering can be categorized into DC sputtering and RF sputtering. DC sputtering is often used for semiconductor materials. The reactive sputtering can be made with different input gases. In general, oxygen or nitrogen is input for making oxide or nitride respectively. RF sputtering could be widely applied to a variety of materials, mostly to non-conducting materials.

The object body for surface treatment is usually of a flat shape. Therefore, during the sputtering process, the object body needs to be fastened only, or merely be rotated at one degree of freedom, to achieve the purpose of homogeneous coating film. However, due to a cylinder shape having not only a 360-degree surface but also a length, simply fastening the object body or rotating it at one degree of freedom may end up with ultra thickness at some particular spots and cannot achieve the effect of homogeneous film coating.

To overcome the issue set forth in the prior paragraph, the present invention employs combinations of mechanical structures to acquire switching as well as combination of power directions and achieve the effect of multi-degree-of-freedom rotation simultaneously.

SUMMARY OF THE INVENTION

The present invention provides a clipping device for generating a multi-degree-of-freedom rotation from a single power input. The effect of homogeneous film coating is achievable by multi-degree-of-freedom rotation of the specimen when performing a surface treatment, particularly for a cylinder specimen. In accordance with the above-mentioned purpose, the present invention provides a mechanical device for transmitting a torque to generate a multi-degree-of-freedom rotation, including an immovable frame fastening the device and having a first hole and a first sleeve located at the frame center, communicating with the first hole and having a first transmission element; a first shaft, located at the frame center through the first hole as well as the first sleeve, and having a second hole; a second shaft located in the second hole, perpendicular to the first shaft, and having a second sleeve, including a second transmission element having a first and a second ends, and meshing with the first transmission element at the first end of the second transmission element, for driving the second sleeve in accordance with a rotation of the first shaft; and a third transmission element, located at the second end of the second transmission element; a third shaft having a fourth transmission element; a fourth shaft; a first connecting element connecting the second and the third shafts, and letting the third and the fourth transmission elements mesh together; and a second connecting element connecting the second and the fourth shafts.

In accordance with the same aspect of the present invention, the third transmission element further comprises a balance sleeve including a first balance element having a first and a second ends, in which the second end thereof is adjacent to the first transmission element; and a second balance element located at the second end of the first balance element, and the fourth shaft has a third balance element.

Preferably, each of the first, the second and the third balance elements is an idler, each of the first and the second transmission elements is a bevel gear, and each of the third and the fourth transmission elements is a spur gear.

Preferably, the fourth transmission element has a first fastening element and the fourth shaft has a second fastening element relative to the first fastening element.

Preferably, the first fastening element is one selected from a group consisting of a spring clip, a screw fastener and a tenon, and the second fastening element is one selected from a group consisting of a spring clip, a screw fastener, a mortise and a tenon.

Preferably, the mechanical device is for use in a deposition machine, the first fastening element is one selected from a group consisting of a spring clip, a screw fastener and a tenon, and the second fastening element is one selected from a group consisting of a spring clip, a screw fastener, a mortise and a tenon.

Preferably, the mechanical device further comprises a plurality of third shafts, each of which has the fourth transmission element; a third connecting element connecting the plurality of third shafts and letting the fourth transmission elements mesh with each other; a plurality of fourth shafts, each of which has a first balance element; and a fourth connecting element connecting the fourth shafts.

Preferably, each of the first and the second transmission elements is a bevel gear, and each of the third and the fourth transmission elements is a spur gear.

In accordance with another aspect of the present invention, a mechanical device for transmitting a torque to generate a multi-degree-of-freedom rotation is provided. The mechanical device comprises an immovable frame fastening the mechanical device, and including a first hole; and a first sleeve located at the frame center, communicating with the first hole, and having a first transmission element; a first shaft located at the frame center through the first hole and the first sleeve, and having a second hole; a second shaft located in the second hole, perpendicular to the first shaft, and including a second sleeve comprising a second transmission element having a first and a second ends, and meshing with the first transmission element at the first end, for driving the second sleeve in accordance with a rotation of the first shaft; a third transmission element located at the second end of the second transmission element; and a first connecting element located at the second shaft and adjacent to the third transmission element; and a third sleeve including a first balance element having a first and a second ends, and contacted with the first transmission element at the first end of the first balance element; a second balance element located at the second end of the first balance element; and a second connecting element located at the second shaft and adjacent to the second balance element; and a third shaft located between the first and the second connecting elements and parallel to the second shaft, including a fourth transmission element meshing with the third transmission element and having a plurality of fifth shafts aligned in a ring shape, in which each of the plurality of fifth shafts has a fifth transmission element; a sixth transmission element located at the third shaft and meshing with the fifth transmission elements; and a balance turntable connected with the second balance element.

Preferably, each of the first and the second transmission elements is a bevel gear, and each of the third, the fourth, the fifth, and the sixth transmission elements is a spur gear.

Preferably, the mechanical device is for use in a deposition machine, each of the first and the second transmission elements is a bevel gear, and each of the third, the fourth, the fifth, and the sixth transmission elements is a spur gear.

Preferably, each of the first, the second balance elements and the balance turntable is an idler.

In accordance with another aspect of the present invention, a mechanical device for universal rotation in a deposition machine is provided. The mechanical device comprises a fastening frame having a first hole and a first sleeve having a first transmission element; a first shaft passing through the first hole and having a second hole; and a second shaft located in the second hole, being perpendicular to the first shaft and having a second sleeve including a second transmission element having a first and a second ends and meshing with the first transmission element at the first end of the second transmission element, for driving the second sleeve in accordance with a rotation of the first shaft; and a third transmission element having a first and a second ends, in which the first end of the third transmission element is located at the second end of the second transmission element.

Preferably, the second shaft has a balance sleeve having a first and a second balance elements. The mechanical device further comprises a third shaft having a fourth transmission element meshing with the third transmission element, and having a third balance element located at the second end of the third transmission element, wherein the third shaft has a plurality of clipping devices; and a first and a second connecting elements for connecting the second and the third shafts.

Preferably, each of the first, the second and the third balance elements is an idler, each of the first and the second transmission elements is a bevel gear, and each of the third and the fourth transmission elements is a spur gear.

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
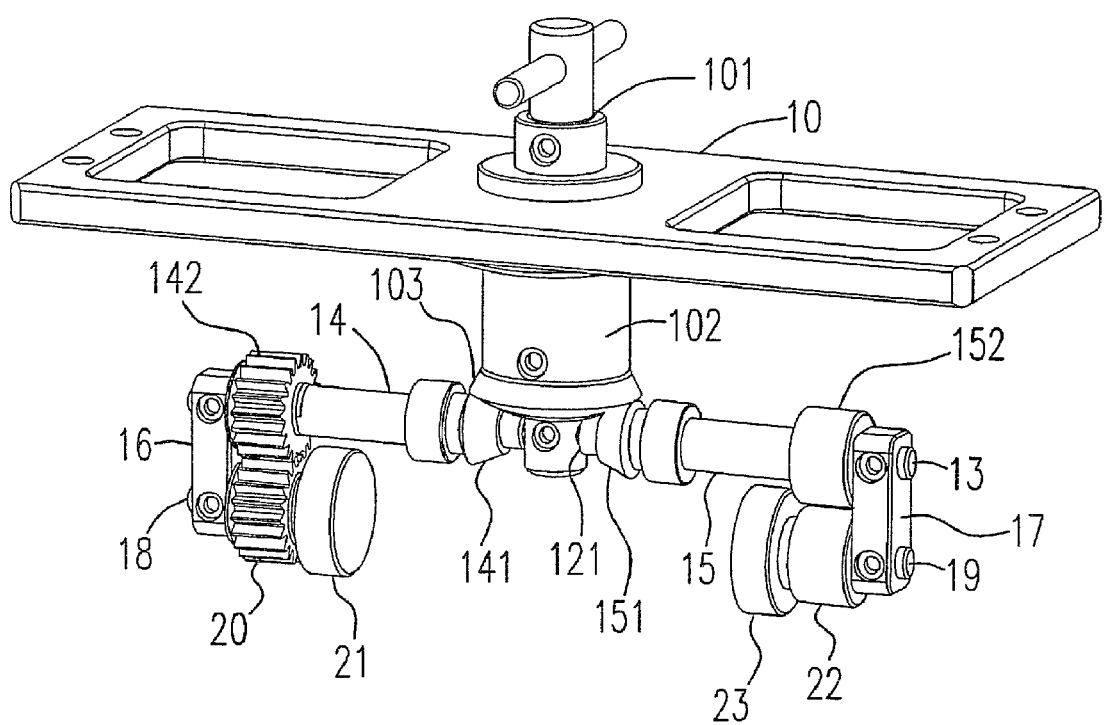
FIG. 1 is a schematic diagram showing the mechanical device for transmitting a torque to generate a multi-degree-of-freedom rotation according to a first embodiment of the present invention.

Please refer to FIG. 1, which is a schematic diagram showing the mechanical device for transmitting a torque to generate a multi-degree-of-freedom rotation according to a first embodiment of the present invention. The mechanical device is used for clipping the object body during a vacuum sputtering process. The mechanical device has a frame 10 for fastening the entire device. There are a hole 101 and a main sleeve 102 on the frame 10. A central hole of the main sleeve 102 is in conjunction with the hole 101 of the frame 10, to accommodate a main shaft (not shown) perpendicular to the frame 10. In addition, a main bevel gear 103 is located at one end of the main sleeve 102. The upper end of the main shaft 12 is connected to a power input. The lower end of the main shaft 12 has a hole 121 for furnishing a horizontal shaft 13. The horizontal shaft 13 has a left and a right portions, and each of which is furnished with a sleeve, the left sleeve 14 and the right sleeve 15 respectively. The left sleeve 14 has a left bevel gear 141 meshed with the main bevel gear 103 and located at one end adjacent to the main shaft 12, and a first spur gear 142 at the other end. For the purposes of balancing and avoiding a twist when the two sleeves move around the main shaft 12, the right sleeve 15 has neither bevel gear nor spur gear but rather two balancing idlers 151 and 152 corresponding to the left bevel gear 141 and the first spur gear 142 respectively. Shaft connecting elements 16 and 17 are furnished at each end of the horizontal shaft 13, to respectively connect with a left short shaft 18 and a right short shaft 19, both parallel to the horizontal shaft 13. The left short shaft 18 has a second spur gear 20 connected to a clipping turntable 21 and meshed with the first spur gear. The right short shaft 19 has an idler 22 and a tray 23 which is allowed to rotate freely.

When a specimen is fastened between the clipping turntable 21 and the tray 23, initiating the power input (say a torque) and turning the main shaft 12 will drive the horizontal shaft 13 to move around on a horizontal plane. Meanwhile, the left bevel gear 141 meshed with the main bevel gear 103 is rotating around the main bevel gear 103 due to the horizontal movement of the horizontal shaft 13 and driving a rotation of the left sleeve 14 and the first spur gear 142. For the second spur gear 20 is meshed with the first spur gear 142, the rotation of the first spur gear 142 will drive a rotation of the second spur gear 20 and also a rotation of the clipping turntable 21 connected to the second spur gear 20. On the other hand, only the balancing idlers 151, 152, and 22 are furnished at the right sleeve 15 and the right short shaft 19, so there is no power transmission therebetween. Furthermore, since the tray 23 is allowed to rotation freely, it will follow the rotation of the clipping turntable 21 via a transmission of the specimen. According to the description set forth above, requiring a single power input to the mechanical device, the specimen may be moved around following the horizontal shaft 13 and rotated together with the clipping turntable 21 simultaneously, thereby achieving a multi-degree-of-freedom rotation.

Figure 2:
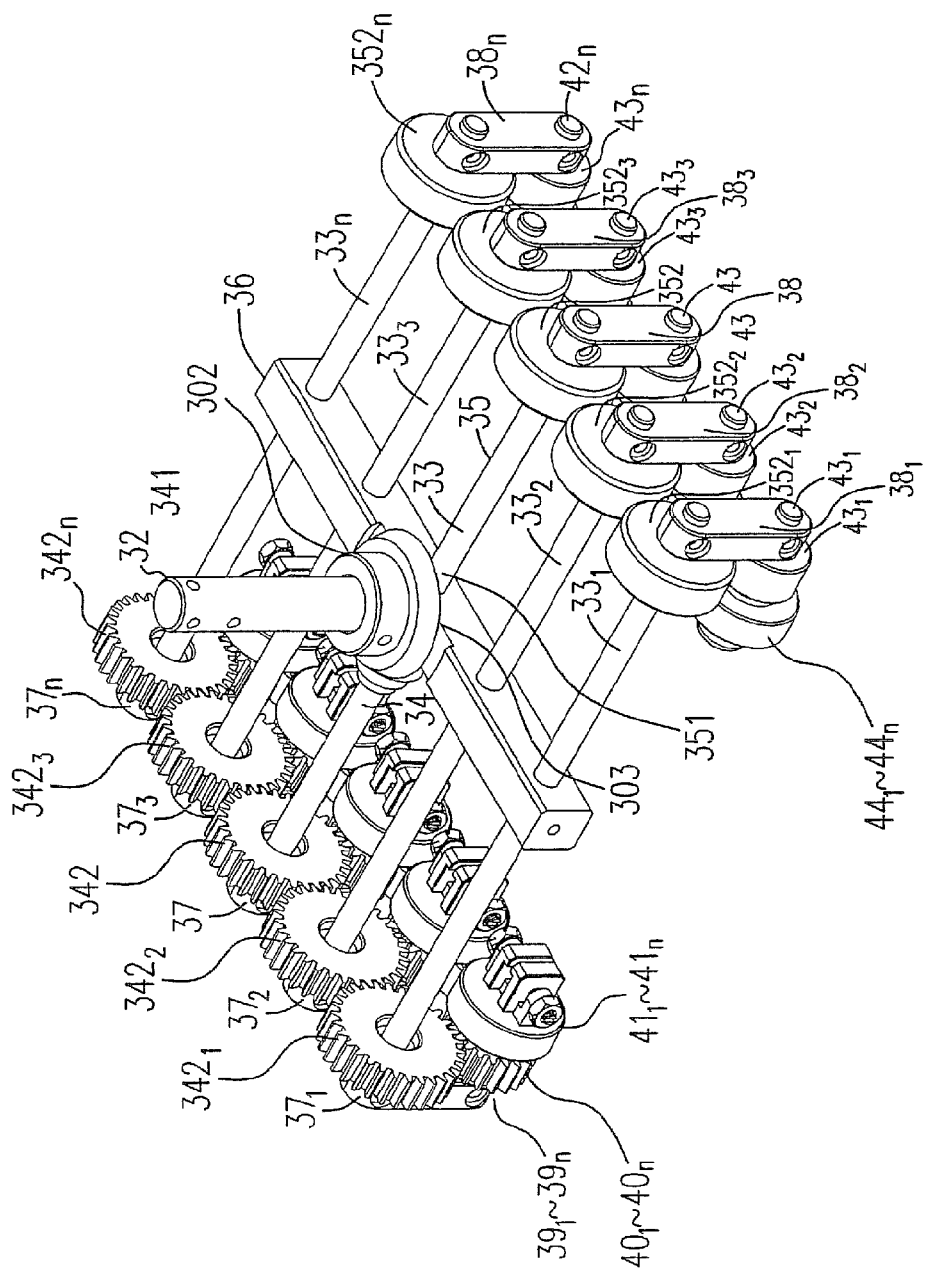
FIG. 2 is a schematic diagram showing the mechanical device for transmitting a torque to generate a multi-degree-of-freedom rotation according to a second embodiment of the present invention.

Please refer to FIG. 2, which is a schematic diagram showing the mechanical device for transmitting a torque to generate a multi-degree-of-freedom rotation according to a second embodiment of the present invention. The mechanical device is used for clipping the object body during a vacuum sputtering process. The mechanical device has a frame (not shown) for fastening the entire device. There are a hole (not shown) and a main sleeve 302 on the frame. A central hole of the main sleeve 302 is in conjunction with the hole 301 of the frame, to accommodate a main shaft 32 perpendicular to the frame. In addition, a main bevel gear 303 is located at one end of the main sleeve 302. The upper end of the main shaft 32 is connected to a power input. The lower end of the main shaft 32 has a hole 321 for furnishing a horizontal shaft 33. The horizontal shaft 33 has a left and a right portions, each of which is furnished with a sleeve, the left sleeve 34 and the right sleeve 35 respectively. The left sleeve 34 has a left bevel gear 341 meshed with the main bevel gear 303 and located at one end adjacent to the main shaft 32, and a first spur gear 342 at the other end. For the purposes of balancing and avoiding a twist when the two sleeves move around the main shaft 32, the right sleeve 35 has neither bevel gear nor spur gear but rather two balancing idlers 351 and 352 corresponding to the left bevel gear 341 and the first spur gear 342 respectively. A main shaft-connecting element 36 is furnished at the center of the horizontal shaft 33. Along a horizontal direction, a plurality of horizontal shafts $33_1, 33_2, 33_3 \ldots 33_n$ are furnished on the main shaft-connecting element 36. Each of the horizontal shafts $33_1, 33_2, 33_3 \ldots 33_n$ is respectively furnished with a first spur gear $342_1, 342_2, 342_3 \ldots 342_n$ and a shaft-connecting element $37_1, 37_2, 37_3 \ldots 37_n$ to respectively connect with a left short shaft $39_1, 39_2, 39_3 \ldots 39_n$. The first spur gears $342_1, 342_2, 342_3 \ldots 342_n$ are meshed with each other. Each of the left short shafts $39_1, 39_2, 39_3 \ldots 39_n$ has a second spur gear $40_1, 40_2, 40_3 \ldots 40_n$ connected to a clipping turntable $41_1, 41_2, 41_3 \ldots 41_n$ respectively. The second spur gears $40_1, 40_2, 40_3 \ldots 40_n$ are respectively meshed with the corresponding first spur gears $342_1, 342_2, 342_3 \ldots 342_n$. The right portion of each horizontal shaft $33_1, 33_2, 33_3 \ldots 33_n$ is furnished with an idler $352_1, 352_2, 352_3 \ldots 352_n$ and a shaft-connecting element $38_1, 38_2, 38_3, \ldots 38_n$ respectively. The shaft-connecting elements $38_1, 38_2, 38_3 \ldots 38_n$ are connected to a plurality of right short shafts $42_1, 42_2, 42_3 \ldots 42_n$ respectively. Each of the right short shafts $42_1, 42_2, 42_3 \ldots 42_n$ has another idler $43_1, 43_2, 43_3 \ldots 43_n$ and a tray $44_1, 44_2, 44_3 \ldots 44_n$ respectively, and the tray $44_1, 44_2, 44_3 \ldots 44_n$ is allowed to be rotated freely.

When specimens are fastened between the clipping turntables $41_1, 41_2, 41_3 \ldots 41_n$ and the trays $44_1, 44_2, 44_3 \ldots 44_n$, initiating the power input (say a torque) and turning the main shaft 32 will drive the horizontal shaft 33 to move around on a horizontal plane. Meanwhile, the left bevel gears $342_1, 342_2, 342_3 \ldots 342_n$ meshed with the main bevel gear 303 are rotating around the main bevel gear 303 due to the horizontal movement of the horizontal shafts $33_1, 33_2, 33_3 \ldots 33_n$ and driving a rotation of the left sleeve 34 and the first spur gears $342_1, 342_2, 342_3 \ldots 342_n$. For the second spur gears $40_1, 40_2, 40_3 \ldots 40_n$ are meshed with the first spur gears $342_1, 342_2, 342_3 \ldots 342_n$, the rotation of the first spur gear will drive a rotation of the second spur gears $40_1, 40_1, 40_n$ and also a rotation of the clipping turntables $41_1, 41_2, 41_3 \ldots 41_n$ connected to the second spur gears $40_1, 40_2, 40_3 \ldots 40_n$. On the other hand, only the balancing idlers $351, 352_1, 352_2, 352_3 \ldots 352_n$, and $43_1, 43_2, 43_3 \ldots 43_n$ are furnished at the right sleeve 35 and the right short shafts $42_1, 42_2, 42_3 \ldots 42_n$, so there is no power transmission therebetween. Furthermore, since the trays $44_1, 44_2, 44_3 \ldots 44_n$ are allowed to rotate freely, they will follow the rotation of the clipping turntables $41_1, 41_2, 41_3 \ldots 41_n$ via a transmission of the specimen. According to the description set forth above, requiring a single power input to the mechanical device, the specimens may be moved around following the horizontal shafts $33_1, 33_2, 33_3 \ldots 33_n$ and rotated together with the clipping turntables $41_1, 41_2, 41_3 \ldots 41_n$ simultaneously, thereby achieving the multi-degree-of-freedom rotations.

Figure 3:
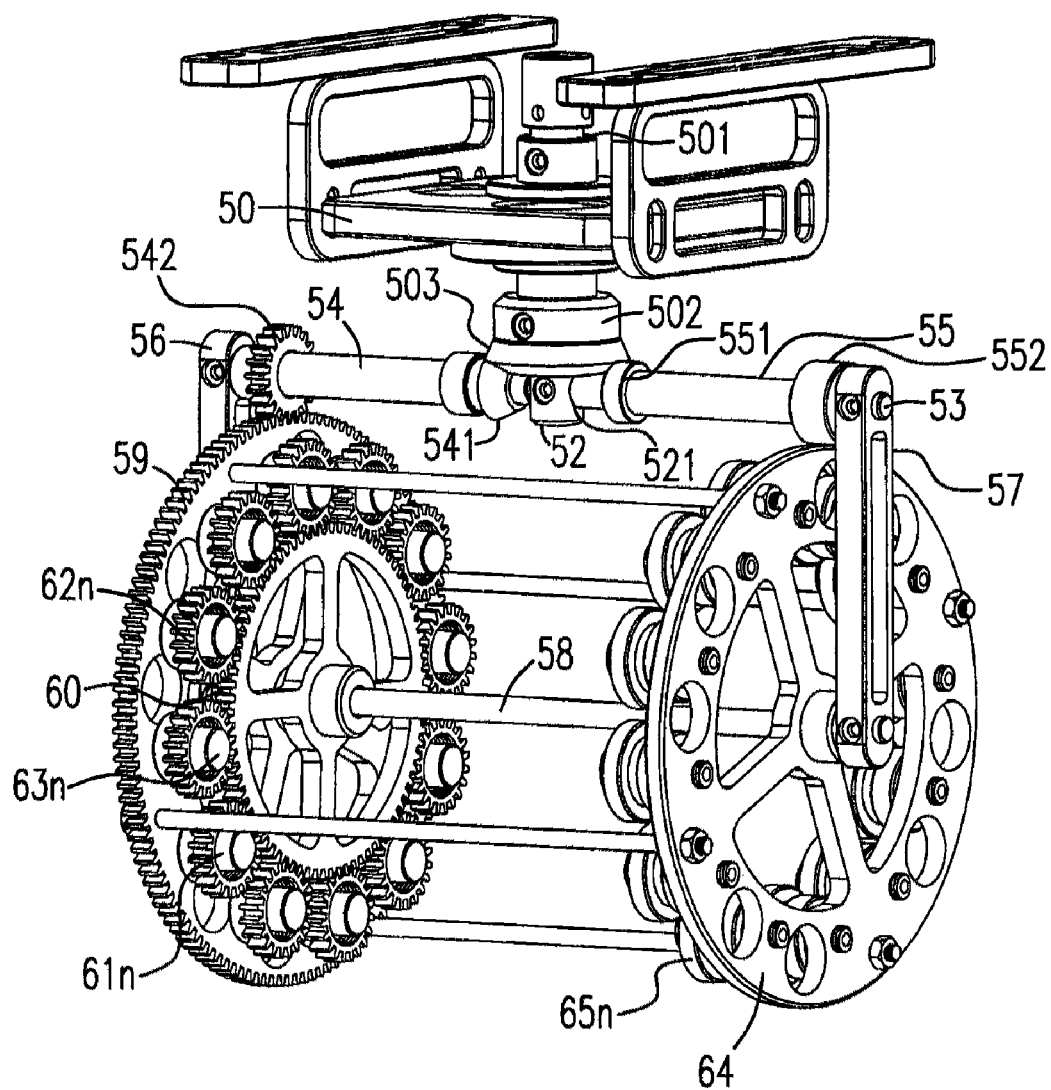
FIG. 3 is a schematic diagram showing the mechanical device for transmitting a torque to generate a multi-degree-of-freedom rotation according to a third embodiment of the present invention.

Please refer to FIG. 3, which is a schematic diagram showing the mechanical device for transmitting a torque so as to generate a multi-degree-of-freedom rotation according to a third embodiment of the present invention. The mechanical device is used for clipping a specimen during a vacuum sputtering process. The mechanical device has a frame 50 for fastening and sustaining the entire mechanical device. A first hole 501 and a main sleeve (i.e. a first sleeve) 502 are disposed on the frame 50. A central hole (not shown) of the main sleeve the first sleeve) 502 is in conjunction with the hole 501 of the frame 50, to accommodate a main shaft (i.e. a first shaft) (52) perpendicular to the frame 50. In addition, a main bevel gear (i.e. a first transmission element) 503, is located at the lower end of the main sleeve (the first sleeve) 502. The upper end of the main shaft (the first shaft) 52 is connected to a power input which is preferably a torque. The lower end of the main shaft (the first shaft) 52 has a second hole 521 for furnishing a first horizontal shaft (i.e. a second shaft) 53. The first horizontal shaft (the second shaft) 53 has a left and a right portions, each of which is furnished with a sleeve, that is, a left sleeve (.e. a second sleeve) 54 and a right sleeve (i.e. a third sleeve) 55, respectively. The left sleeve (the second sleeve) 54 has a left bevel gear (i.e. a second transmission element) 541 meshed with the main bevel gear (the first transmission element) 503, and located at one end adjacent to the main shaft 52 and a first spur gear 542 at the other end. For the purposes of balancing and avoiding a twist when the first and the second sleeves 53, 54 move around the main shaft (the first shaft) 52, the right sleeve (the third sleeve) 55 has neither a bevel gear nor a spur gear but two balancing idlers 551 and 552 corresponding to the left bevel gear (the second transmission element) 541 and the first spur gear 542 respectively. A first and a second shaft connecting elements 56, 57 are furnished at each end of the first horizontal shaft (the second shaft) 53, for connecting a second horizontal shaft (the third shaft) 58 parallel to the first horizontal shaft (the second shaft) 53. At the left end of the second horizontal shaft (the third shaft) 58, a second spur gear 59 and the third spur gear 60 are furnished and adjacent to each other, in which the diameter of the second spur gear 59 is larger than that of the third spur gear 60. The second spur gear 59 is meshed with the first spur gear 542 and has a plurality of short shafts $61_1, 61_2, 61_3 \ldots 61_n$ surrounding the third spur gear 60. Each of the short shafts $61_1, 61_2, 61_3 \ldots 61_n$ is furnished with respective a fourth spur gear $62_1, 62_2, 62_3 \ldots 62_n$ connected to a respective clipping turntable $63_1, 63_2, 63_3 \ldots 63_n$. The third spur gear 60 is unmovable on the second horizontal shaft (the third shaft) 58, and is meshed with each of the fourth spur gears $62_1, 62_2, 62_3 \ldots 62_n$. A movable balancing wheel 64 is located at the right end of the second horizontal shaft (the third shaft) 58, and has the same dimension as that of the second spur gear 59. A plurality of movable trays $65_1$, $65_2$, $65_3$ ... $65_n$ are furnished on the balancing wheel 64 and located at the positions corresponding to the clipping turntables $63_1$, $63_2$, $63_3$ ... $63_n$ respectively.

When specimens are fastened between the clipping turntables $63_1$, $63_2$, $63_3$ ... $63_n$ and the trays $65_1$, $65_2$, $65_3$ ... $65_n$, initiating the power input (say a torque) and turning the main shaft (the first shaft) 52 will drive the first horizontal shaft (the second shaft) 53 to move around on a horizontal plane. Meanwhile, the left bevel gear (the second transmission element) 541 meshed with the main bevel gear 503 are rotating around the main bevel gear (the first transmission element) 503 due to the horizontal movement of the first horizontal shaft (the second shaft) 53 and driving a rotation of the left sleeve (the third sleeve) 54 and the first spur gear 542. Since the second spur gear 59 is meshed with the first spur gear 542, the rotation of the first spur gear 542 will drive a rotation of the second spur gear 59 and also a revolution of all the fourth spur gears $62_1$, $62_2$, $62_3$ ... $62_n$ around the third spur gear 60. Since the third spur gear 60 is fixed on the second horizontal shaft (the third shaft) 58 and meshed with the fourth spur gears $62_1$, $62_2$, $62_3$ ... $62_n$, the fourth spur gears $62_1$, $62_2$, $62_3$ ... $62_n$ are driven by the third spur gear 60 and respectively bring the corresponding clipping turntables $63_1$, $63_2$, $63_3$ ... $63_n$ into rotations when the fourth spur gears $62_1$, $62_2$, $62_3$ ... $62_n$ are revolving around the third spur gear 60. On the other hand, only the balancing idlers and wheels 551, 552, and 64 are furnished at the right sleeve (the third sleeve) 55 and the right end of the second horizontal shaft (the third shaft) 58, so there is no power transmission therebetween. Furthermore, since the trays $65_1$, $65_2$, $65_3$ ... $65_n$ are allowed to rotate freely, they will follow the rotation of the clipping turntables $63_1$, $63_2$, $63_3$ ... $63_n$ via a transmission of the specimen. According to the description set forth above, driven by a single power input such as a torque to the mechanical device, specimens (not shown) disposed on the clipping turntables $63_1$, $63_2$, $63_3$ ... $63_n$ may be moved following the rotation of first horizontal shaft (the second shaft) 53, and simultaneously rotated along with the clipping turntables $63_1$, $63_2$, $63_3$ ... $63_n$ which are revolving around the second horizontal shaft (the third shaft) 58, and thereby the multi-degree-of-freedom rotations are achieved.

Figure 4:
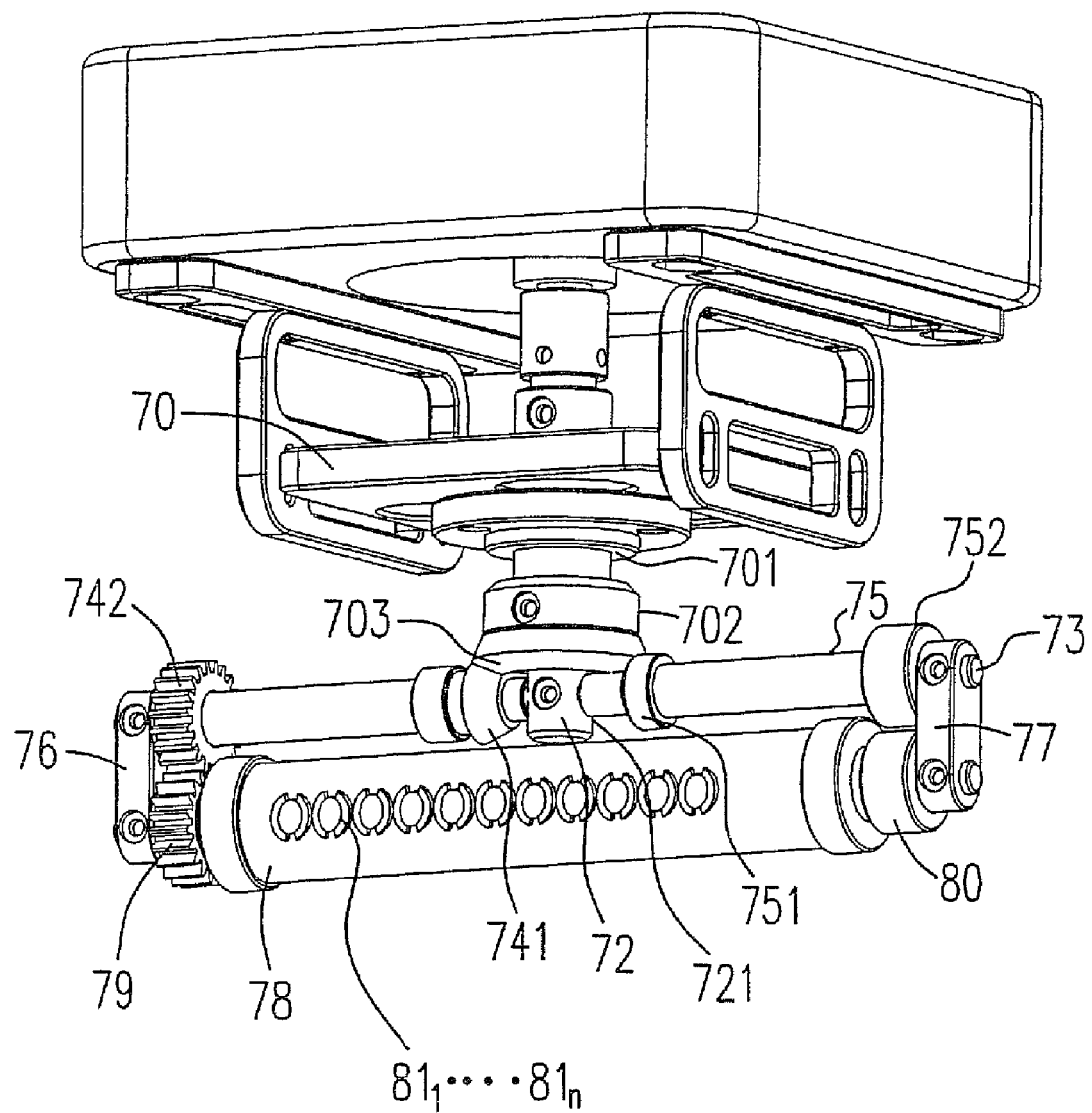
FIG. 4 is a schematic diagram showing the mechanical device for transmitting a torque to generate a multi-degree-of-freedom rotation according to a fourth embodiment of the present invention.

Please refer to FIG. 4, which is a schematic diagram showing the mechanical device for transmitting a torque to generate a multi-degree-of-freedom rotation according to a fourth embodiment of the present invention. The mechanical device is used for clipping the object body during a vacuum sputtering process. The mechanical device has a frame 70 for fastening the entire device. There are a hole 701 and a main sleeve 702 on the frame 70. A central hole of the main sleeve 702 is in conjunction with the hole 701 of the frame 70, to accommodate a main shaft 72 perpendicular to the frame 70. In addition, a main bevel gear 703 is located at one end of the main sleeve 702. The upper end of the main shaft 72 is connected to a power input. The lower end of the main shaft 72 has a hole 721 for furnishing a first horizontal shaft 73. The first horizontal shaft 73 has a left and a right portions, each of which is furnished with a sleeve, the left sleeve 74 and the right sleeve 75 respectively. The left sleeve 74 has a left bevel gear 741 meshed with the main bevel gear 703 and located at one end adjacent to the main shaft 72, and a first spur gear 742 at the other end. For the purposes of balancing and avoiding a twist when the two sleeves move around the main shaft 72, the right sleeve 75 has neither bevel gear nor spur gear but rather two balancing idlers 751 and 752 corresponding to the left bevel gear 741 and the first spur gear 742 respectively. Shaft connecting elements 76 and 77 are furnished at each end of the horizontal shaft 73, to connect the first horizontal shaft 73 with a second horizontal shaft 78. The second horizontal shaft 78 has a second spur gear 79 meshed with the first spur gear 742 at its left end, and is furnished with an idler 80 at its right end. In addition, the second horizontal shaft 78 is furnished with a plurality of clipping devices $81_1$, $81_2$, $81_3$ ... $81_n$ for carrying small specimens such as mirrors.

Similarly, all the specimens clipped by the clipping devices $81_1$, $81_2$, $81_3$ ... $81_n$ will revolve around the second horizontal shaft 78 and circle around the axis of the main shaft 72 by following the first horizontal shaft 73 when a signal power input (say a torque) is applied to the mechanical device, thereby achieving a multi-degree-of-freedom rotation.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims that are to be accorded with the broadest interpretation so as to encompass all such modifications and similar structures.

What is claimed is:

1. A mechanical device for transmitting a torque so as to generate a multi-degree-of-freedom rotation, comprising:
    an immovable frame fastening the device and including:
        a first hole; and
        a first sleeve disposed in the first hole, and having a first transmission element;
    a first shaft, disposed inside the first hole and the first sleeve, and having a second hole;
    a second shaft disposed in the second hole, perpendicular to the first shaft, and including:
        a second sleeve including:
            a second transmission element having a first and a second ends, and meshing with the first transmission element at the first end of the second transmission element, for driving the second sleeve in accordance with a rotation of the first shaft; and
            a first spur gear, disposed at the second end of the second transmission element;
    a third shaft having a first and a second ends, wherein a second spur gear is disposed at the first end of the third shaft;
    a first connecting element connecting the second and the third shafts, and letting the first and the second spur gears mesh together; and
    a second connecting element connecting the second and the third shafts.

2. A mechanical device as claimed in claim 1, wherein the second shaft includes a portion opposite to the second sleeve, and the mechanical device further comprises:
    a third sleeve disposed on the portion of the second shaft;
    a first balance element having a first and a second ends, wherein the second end thereof is adjacent to the first transmission element;
    a second balance element located at the second end of the first balance element; and
    a third balance element is disposed at the second end of the third shaft.

3. A mechanical device as claimed in claim 2, wherein each of the first, the second and the third balance elements is an idler.

4. A mechanical device as claimed in claim 1, wherein each of the first and the second transmission elements is a bevel gear.

5. A mechanical device as claimed in claim 1, further comprising:
- a plurality of third shafts, each of which has the fourth transmission element;
- a third connecting element connecting the plurality of third shafts and letting the fourth transmission elements mesh with each other;
- a plurality of fourth shafts, each of which has a first balance element; and
- a fourth connecting element connecting the fourth shaft.

6. A mechanical device as claimed in claim 5, wherein each of the first and the second transmission elements is a bevel gear.

7. A mechanical device as claimed in claim 5, wherein each of the third and the fourth transmission elements is a spur gear.

8. A mechanical device for transmitting a torque so as to generate a multi-degree-of-freedom rotation, comprising:
- an immovable frame fastening the mechanical device, and including:
  - a first hole; and
  - a first sleeve disposed in the first hole, and having a first transmission element;
- a first shaft disposed inside the first hole and the first sleeve, and having a second hole;
- a second shaft disposed in the second hole, perpendicular to the first shaft, and including:
  - a second sleeve including:
    - a second transmission element having a first and a second ends, and meshing with the first transmission element at the first end, for driving the second sleeve in accordance with a rotation of the first shaft;
    - a first spur gear disposed at the second end of the second transmission element; and
    - a first connecting element located at the second shaft and adjacent to the first spur gear; and
  - a third sleeve including:
    - a first balance element having a first and a second ends, and contacted with the first transmission element at the first end of the first balance element;
    - a second balance element disposed at the second end of the first balance element; and
    - a second connecting element disposed at the second shaft and adjacent to the second balance element; and
- a third shaft located between the first and the second connecting elements and parallel to the second shaft, including:
  - a second spur gear meshing with the first spur gear and having a plurality of fourth shafts aligned in a ring shape;
  - a third spur gear located at the third shaft; and
  - a balance turntable connected with the second balance element, wherein each of the plurality of fourth shafts has a fourth spur gear, and the third spur gear meshes with each of the plurality of fourth spur gears.

9. A mechanical device as claimed in claim 8, wherein each of the first and the second transmission elements is a bevel gear.

10. A mechanical device as claimed in claim 8, being for use in a deposition machine, wherein each of the first and the second transmission elements is a bevel gear.

11. A mechanical device as claimed in claim 8, wherein each of the first, the second balance elements and the balance turntable is an idler.

12. A mechanical device as claimed in claim 8, wherein the second shaft has a balance sleeve having a first and a second balance elements, further comprising:
- a third shaft having a fourth transmission element meshing with the third transmission element, and having a third balance element located at the second end of the third transmission element, wherein the third shaft has a plurality of clipping devices; and
- a first and a second connecting elements for connecting the second and the third shafts.

13. A mechanical device as claimed in claim 12, wherein each of the first, the second and the third balance elements is an idler.

14. A mechanical device as claimed in claim 12, wherein each of the third and the fourth transmission elements is a spur gear.

* * * * *